US008273407B2

(12) United States Patent
Bergendahl et al.

(10) Patent No.: US 8,273,407 B2
(45) Date of Patent: Sep. 25, 2012

(54) SYSTEMS AND METHODS FOR FORMING MAGNETIC NANOCOMPOSITE MATERIALS

(76) Inventors: Albert S. Bergendahl, Jericho, VT (US); Paul C. Castrucci, South Burlington, VT (US); Daniel J. Fleming, South Burlington, VT (US); Danny Tongsan Xiao, Willington, CT (US)

(*) Notice: Subject to any disclaimer, the term of this patent is extended or adjusted under 35 U.S.C. 154(b) by 909 days.

(21) Appl. No.: 11/668,293

(22) Filed: Jan. 29, 2007

(65) Prior Publication Data
US 2007/0178229 A1    Aug. 2, 2007

Related U.S. Application Data

(60) Provisional application No. 60/763,327, filed on Jan. 30, 2006.

(51) Int. Cl.
 *C23C 16/02* (2006.01)
(52) U.S. Cl. .................. 427/248.1; 427/127; 427/128; 427/212; 427/217
(58) Field of Classification Search .......... 427/128, 427/248.1, 127, 212, 217
See application file for complete search history.

(56) References Cited

U.S. PATENT DOCUMENTS

| | | | | |
|---|---|---|---|---|
| 6,696,107 | B2 * | 2/2004 | Eastham | 427/550 |
| 2002/0142163 | A1 * | 10/2002 | Mino et al. | 428/403 |
| 2004/0119064 | A1 * | 6/2004 | Narayan et al. | 257/14 |
| 2004/0209098 | A1 * | 10/2004 | Kobayashi et al. | 428/493 |
| 2005/0074600 | A1 * | 4/2005 | Ma et al. | 428/328 |
| 2006/0003267 | A1 * | 1/2006 | Ramamoorthi et al. | 430/322 |
| 2006/0083694 | A1 * | 4/2006 | Kodas et al. | 424/46 |
| 2006/0225534 | A1 * | 10/2006 | Swihart et al. | 75/343 |

FOREIGN PATENT DOCUMENTS
JP    61-153821    * 7/1986
* cited by examiner

*Primary Examiner* — Timothy Meeks
*Assistant Examiner* — Elizabeth Burkhart
(74) *Attorney, Agent, or Firm* — Aliki K. Collins; AKC Patents LLC

(57) ABSTRACT

A method of fabricating a film of magnetic nanocomposite particles including depositing isolated clusters of magnetic nanoparticles onto a substrate surface and coating the isolated clusters of magnetic nanoparticles with an insulator coating. The isolated clusters of magnetic nanoparticles have a dimension in the range between 1 and 300 nanometers and are separated from each other by a distance in the range between 1 and 50 nanometers. By employing PVD, ablation, and CVD techniques the range of useful film thicknesses is extended to 10-1000 nm, suitable for use in wafer based processing. The described methods for depositing the magnetic nanocomposite thin films are compatible with conventional IC wafer and Integrated Passive Device fabrication.

29 Claims, 8 Drawing Sheets

SYSTEMS AND METHODS FOR FORMING MAGNETIC NANOCOMPOSITE MATERIALS

CROSS REFERENCE TO RELATED CO-PENDING APPLICATIONS

This application claims the benefit of U.S. provisional application Ser. No. 60/763,327 filed on Jan. 30, 2006 and entitled "SYSTEMS AND METHODS FOR FORMING MAGNETIC NANOCOMPOSITE MATERIALS", the contents of which are expressly incorporated herein by reference.

FIELD OF THE INVENTION

The present invention relates to systems and method for forming magnetic nanocomposite materials via thin film deposition techniques.

BACKGROUND OF THE INVENTION

Magnetic nanocomposite materials are composites of magnetic and insulator materials and have ultrafine grains or particles with dimensions of less than 300 nanometers. When small enough particles of magnetic materials, of order 2-300 nm in size, are sheathed in thin layers of insulators, of order 1-50 nm in thickness, and formed in such a way that the exchange coupling between the particles of nearest neighboring particles is realized, the resulting materials have both excellent magnetic and insulating properties. Materials of this sort have been made into useful forms for electronic devices such as inductors by techniques such as squeegee application of epoxies loaded with such particles or by electroplating. Such techniques are useful for films of 100-1000 microns and 5-100 microns, respectively that are useful in forming thick film passive devices such as inductors. However, for devices integrated within a semiconductor wafer or thin film passive device wafer, film thicknesses of less than a few microns are desired. Accordingly, there is a need for a thin film deposition technique for magnetic nanocomposite materials that is appropriate for integration with conventional IC wafer and Integrated Passive Device fabrication.

SUMMARY OF THE INVENTION

In general, in one aspect, the invention features a method of fabricating a film of magnetic nanocomposite particles including depositing isolated clusters of magnetic nanoparticles onto a substrate surface and then coating the isolated clusters of magnetic nanoparticles with an insulator coating. The isolated clusters of magnetic nanoparticles have a dimension in the range between 1 and 300 nanometers and are separated from each other by a distance in the range between 1 and 50 nanometers.

Implementations of this aspect of the invention may include one or more of the following features. The depositing and coating are repeated until a desired film thickness is achieved. The method also includes measuring the film thickness. The film thickness is in the range between 10 and 1000 nanometers. The isolated clusters of magnetic nanoparticles are deposited via a physical vapor deposition (PVD) process. The isolated clusters of magnetic nanoparticles are coated with an insulator via chemical vapor deposition (CVD) process or via PVD process. The insulator coating thickness is in the range between 1 and 30 nanometers. The method may further include aggregating the isolated clusters of magnetic nanoparticles before the coating. The aggregating may include thermally annealing the deposited isolated clusters of magnetic nanoparticles, or irradiating the deposited isolated clusters of magnetic nanoparticles with a light source such as lasers or UV light sources. The magnetic nanoparticles may be Fe, Ni, Co, NiCo, FeZn, borides of these materials, ferrites, rare-earth metals, or alloy combinations thereof. The substrate may be fused silica, oxidized silicon, quartz, or silicon, GaAs, GaN, high temperature glass, alumina, silicon nitride, silicon carbide, semiconductor materials, refractive insulators, or organic printed circuit board materials. The insulator coating may be $SiO_2$, $Si_3N_4$, $Al_2O_3$, oxides, ceramics, polymers, organic material or ferrites, epoxies, Teflon®, and silicones or combinations thereof. The depositing and the coating may occur simultaneously and in the same reactor. The isolated clusters of magnetic nanoparticles may be deposited via sputtering a target comprising the magnetic material. The isolated clusters of magnetic nanoparticles may be deposited via CVD. In the CVD process the magnetic nanoparticles may be formed by decomposing carbonyl precursors of the magnetic material via electromagnetic radiation. Alternatively, the isolated clusters of magnetic nanoparticles may be deposited via an ion cluster beam (ICB) deposition process. The deposition of isolated clusters of magnetic nanoparticles may include ablating the magnetic nanoparticles from a target comprising the magnetic material and condensing the magnetic nanoparticles onto the substrate surface. The magnetic nanoparticles may be ablated from the target by electromagnetic radiation from a source such as lasers, UV light, Radio Frequency (RF) waves or microwaves. The ablated magnetic nanoparticles may be further ionized by a particle beam such as electron beam, ion beam, or molecular beam. The target may be rotated and/or rocked during the ablation process. The substrate may be rotated and/or rocked during the deposition process. The coating of the isolated clusters of magnetic nanoparticles with the insulator coating may include ablating particles of the insulator from a target comprising the insulator and condensing the ablated insulator particles onto the magnetic nanoparticles and the substrate surface. The ablating of the magnetic nanoparticles and the ablating of the insulator particles may occur simultaneously in the same reactor. The deposition may be enhanced by a magnetic field or electric field. The coating may be enhanced by an electric field or magnetic field.

In general, in another aspect, the invention features an apparatus for fabricating a film of magnetic nanocomposite particles including equipment for depositing isolated clusters of magnetic nanoparticles onto a substrate surface and equipment for coating the isolated clusters of magnetic nanoparticles with an insulator coating. The isolated clusters of magnetic nanoparticles have a dimension in the range between 1 and 300 nanometers and are separated from each other by a distance in the range between 1 and 50 nanometers.

Implementations of this aspect of the invention may include one or more of the following features. The apparatus may further include equipment for measuring the thickness of the film. The deposition equipment may be a physical vapor deposition (PVD) reactor. The coating equipment may be a chemical vapor deposition (CVD) reactor or a PVD reactor. The apparatus may further include equipment for aggregating the isolated clusters of magnetic nanoparticles before the coating. The aggregating equipment may be equipment for thermally annealing the deposited isolated clusters of magnetic nanoparticles, or equipment for irradiating the deposited isolated clusters of magnetic nanoparticles with a light source such as lasers or UV light sources. The deposition equipment and the coating equipments are comprised in the same reactor. The deposition equipment comprises a sputtering reactor or a CVD reactor. In the CVD reactor the magnetic nanoparticles may be formed by decomposing carbonyl precursors of the magnetic material via electromagnetic radiation. The deposition equipment comprises an ion cluster beam (ICB) deposition reactor. The deposition equipment comprises equipment for ablating the magnetic nanoparticles from a target comprising the magnetic material and equipment for condensing the magnetic nanoparticles onto the substrate surface. The ablating equipment comprises an electromagnetic radiation source such as lasers, UV light, Radio Frequency (RF) waves or microwaves. The deposition equipment may further comprise equipment for ionizing the ablated magnetic nanoparticles and the ionizing equipment may be a particle beam source such as an electron beam, an ion beam, or a molecular beam. The target may be rotated and/or rocked during the ablation. The substrate may be rotated and/or rocked during the deposition. The coating equipment comprises equipment for ablating particles of the insulator from a target comprising the insulator and equipment for condensing the insulator particles onto the magnetic nanoparticles and the substrate surface. The ablating of the magnetic nanoparticles and the ablating of the insulator particles may occur simultaneously in the same reactor. The deposition equipment may further comprise a source for a magnetic field or electric field. The coating equipment may further comprise a source for an electric field or magnetic field.

Among the advantages of this invention may be one or more of the following. By employing PVD, ablation, and CVD techniques the range of useful film thicknesses of magnetic nanocomposite particles is extended to 10-1000 nm (0.01-1 micron), so called thin films, for use in wafer based processing. The distribution of core particle sizes is maintained from deposition to deposition so as to assure repeatability in the film properties. Depending on the properties desired, this may be a narrow or broad distribution of particles. Oxidation of the core materials is prevented as this is known to have a deleterious effect on the magnetic properties of such materials caused by the antiferromagnetic effect in these oxides. Maximum performance of the magnetic nanocomposite films is achieved by optimizing the core particle size, their size distribution, particle isolation distance and inter-particle isolation distances to achieve the desired tradeoffs in magnetic permeability, frequency response and dielectric permittivity. An insulating layer of controlled thickness is deposited on the conducting magnetic nanoparticles to eliminate potential eddy current losses when a device based on these magnetic nanoparticles is operated at frequencies in the range between 1 MHz to 100 GHz. The magnetic and dielectric properties of the film are simultaneously adjusted to achieve optimal tunable device characteristics. Chemical reaction or alloying of the magnetic metal nanoparticles and their coated insulating layers is avoided. The described methods for depositing the magnetic nanocomposite thin films are appropriate for integration with conventional IC wafer and Integrated Passive Device production. Patterning of these thin films can be realized via inorganic liftoff, sputter etching, or ion milling techniques The details of one or more embodiments of the invention are set forth in the accompanying drawings and description below. Other features, objects and advantages of the invention will be apparent from the following description of the preferred embodiments, the drawings and from the claims.

BRIEF DESCRIPTION OF THE DRAWINGS

Referring to the figures, wherein like numerals represent like parts throughout the several views.

DETAILED DESCRIPTION OF THE INVENTION

The invention describes several methods for depositing magnetic nanocomposite thin films appropriate for integration with conventional IC wafer and Integrated Passive Device fabrication.

Figure 7:
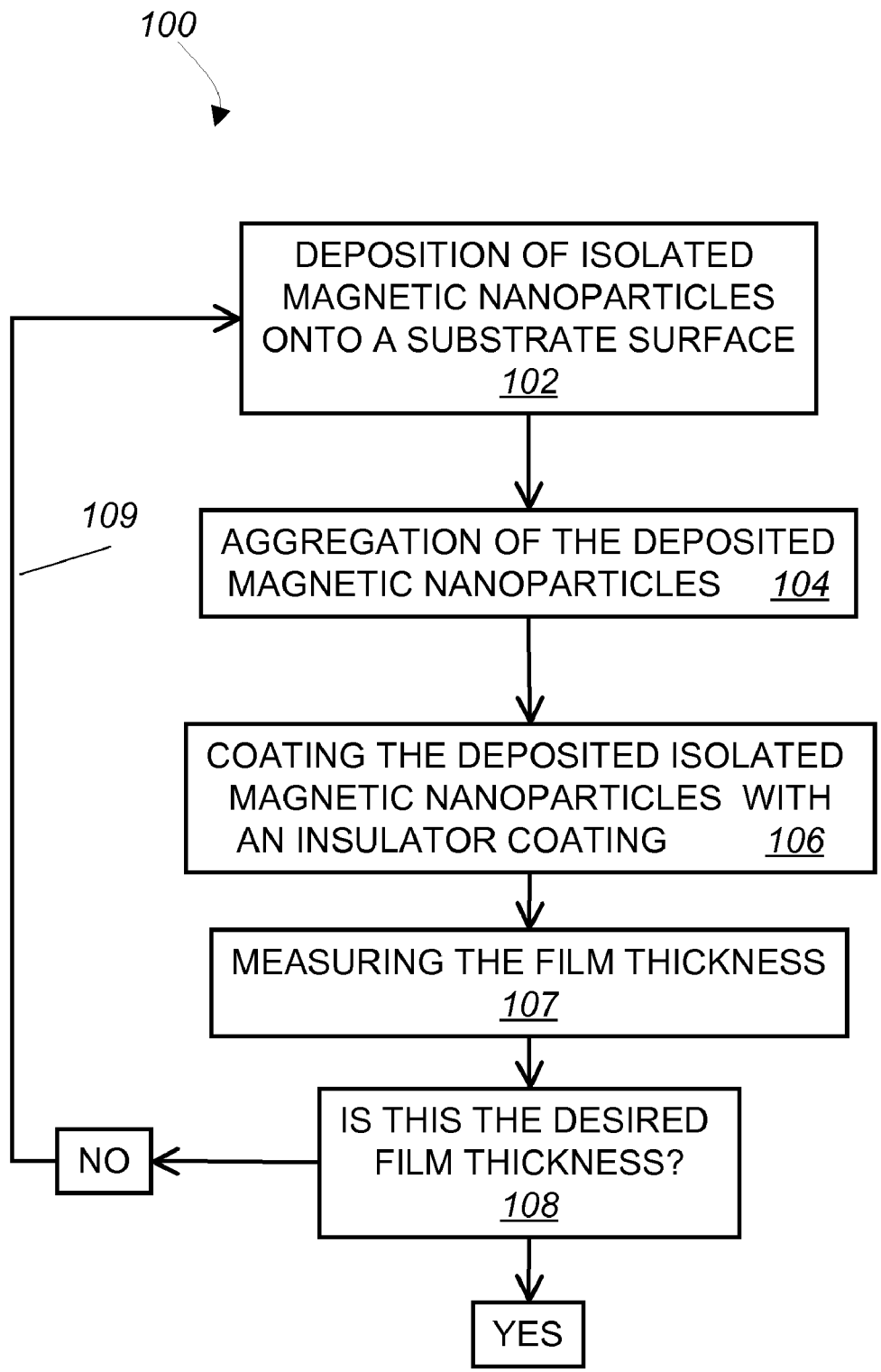
FIG. 7 is a block diagram of the method for fabricating a film of magnetic nanocomposite particles, according to this invention.

Referring to FIG. 7, a method 100 for fabricating a film of magnetic nanocomposite particles includes the steps of depositing isolated clusters of magnetic nanoparticles (102), aggregating the deposited isolated clusters of magnetic nanoparticles (104) and then coating the isolated clusters of magnetic nanoparticles with an insulator coating (106). Next, the thickness of the deposited film is measured (107) and the process repeats itself until a desired thickness of the film is achieved (108). The film thickness is in the range between 10 and 1000 nanometers. Examples of magnetic nanoparticles include Fe, Ni, Co, NiCo, FeZn, borides of these materials, ferrites, rare-earth metals, or alloy combinations thereof. Examples of substrates include fused silica, oxidized silicon, quartz, or silicon, GaAs, GaN, alumina, silicon nitride, silicon carbide, semiconductor materials, refractive insulators, or organic printed circuit board materials. Examples of insulator coating include $SiO_2$, $Si_3N_4$, $Al_2O_3$, oxides, ceramics, polymers, organic material or ferrites, epoxies, Teflon®, and silicones or combinations thereof.

Figure 1A:
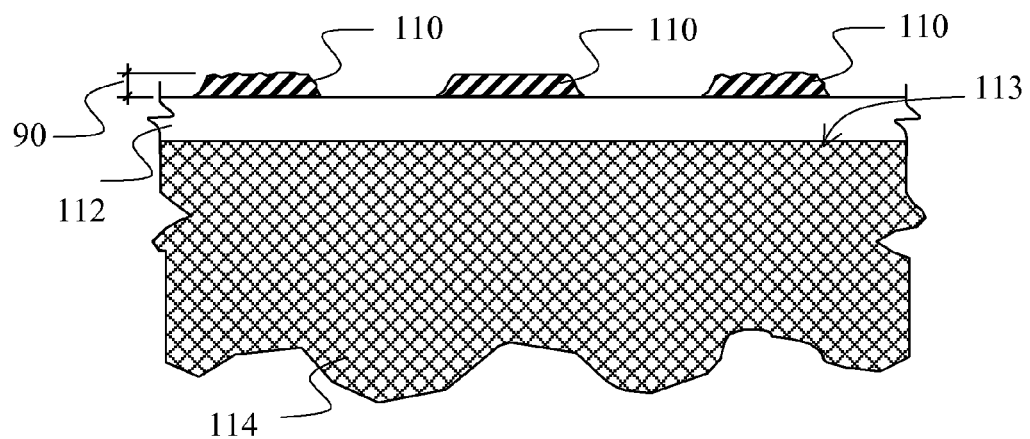
FIG. 1A is a cross-sectional side view of a PVD magnetic nanocomposite material.
Figure 1B:
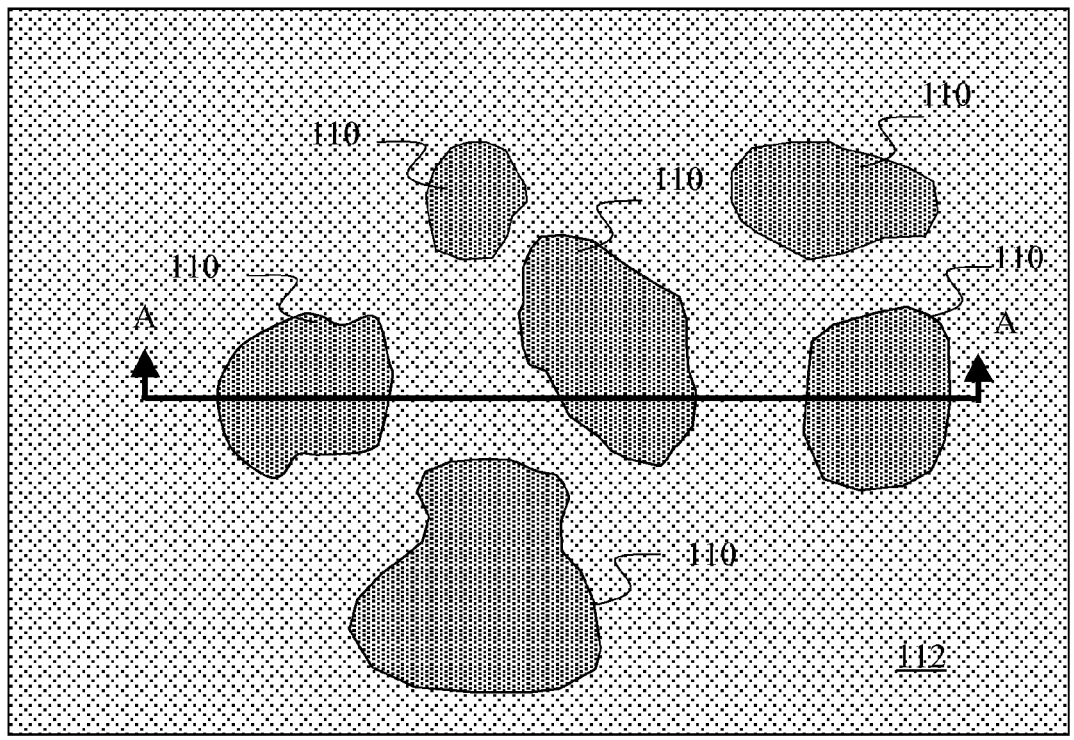
FIG. 1B is a top view of the PVD magnetic nanocomposite material of FIG. 1A.
Figure 1C:
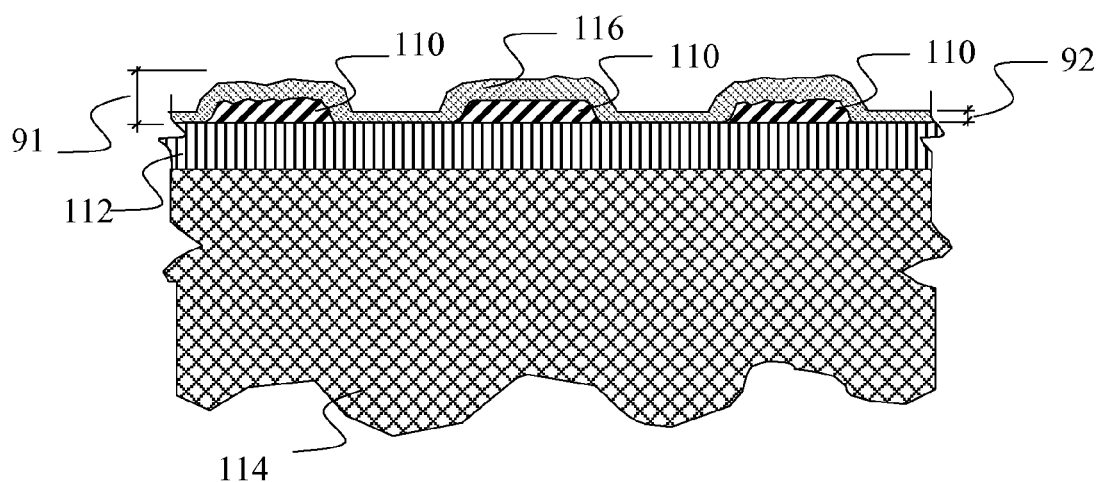
FIG. 1C is a cross-sectional side view of an aggregated PVD magnetic nanocomposite material.
Figure 1D:
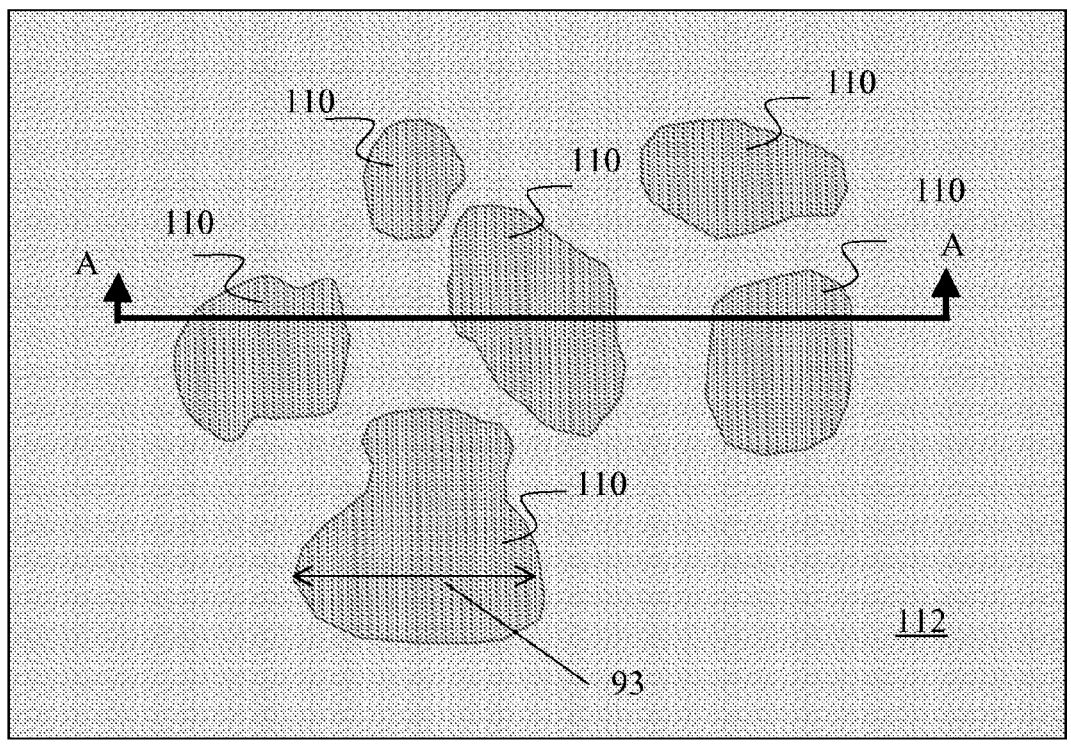
FIG. 1D is a top view of the aggregate PVD magnetic nanocomposite material of FIG. 1C.
Figure 2:
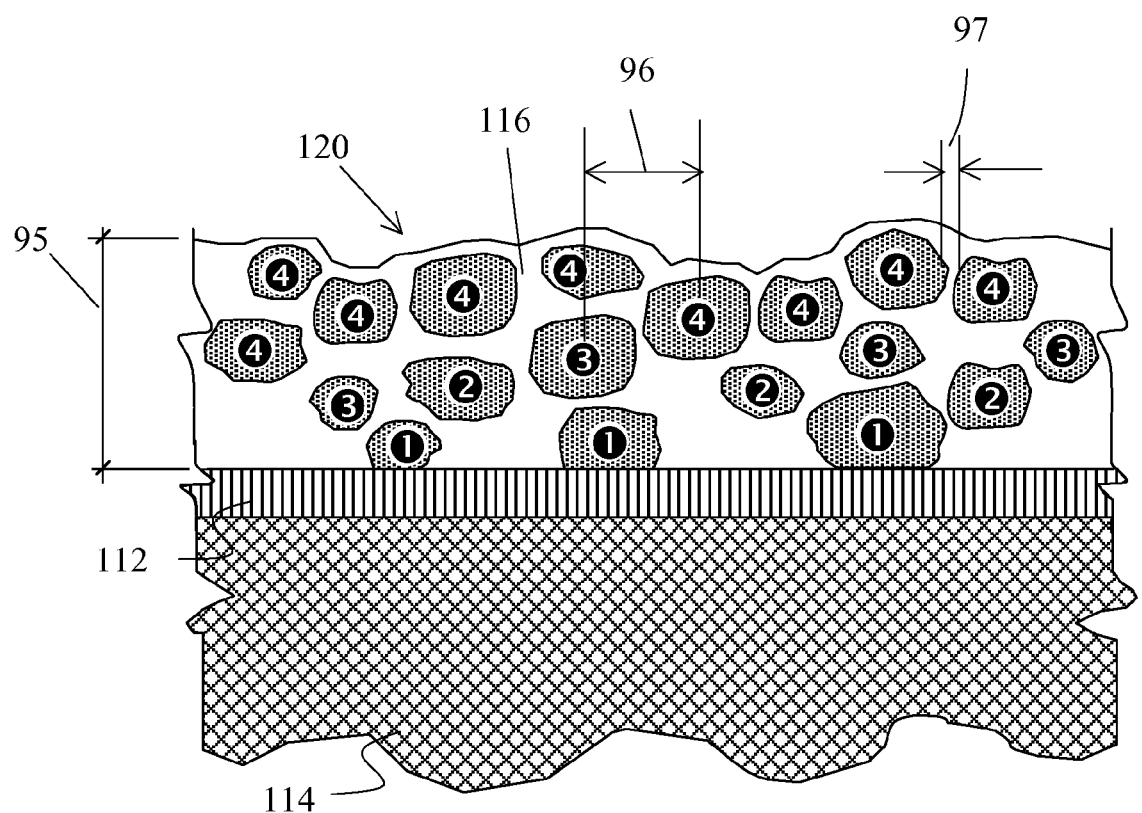
FIG. 2 is a cross-sectional side view of an aggregate PVD magnetic nanocomposite material after four cycles of the sequence shown in FIGS. 1A-1D.

In one embodiment, the magnetic nanoparticles are deposited onto the substrate surface via physical vapor deposition (PVD) technique, so as to form isolated islands of magnetic material. This deposition method takes place in a PVD reactor. PVD is a physical deposition process that does not involve chemical reactions. Examples of PVD techniques that are applicable include evaporative deposition, electron beam PVD (EB-PVD), sputter deposition and pulsed laser deposition, among others. Commercial PVD reactors are offered by Applied Materials (Santa Clara, Calif.), Novellus Systems (San Jose, Calif.) and Balzers (Liechtenstein). In other examples, custom made PVD reactors are used. Referring to FIG. 1A, clusters (islands) of magnetic nanoparticles (core material) 110 are deposited onto a surface 113 of substrate 114. The surface 113 of substrate 114 includes a nucleating layer 112. Examples of nucleating layer 112 include plasma activated $SiO_2$ using techniques such as SUSS MicroTec's nanoPrep technology. The first deposition cycle is truncated at a point where islands formed around nucleation sites are stopped before the islands coalesce in cross section. Next, the deposited core material 110 is aggregated by heating the substrate. In other examples aggregation of the core material occurs by irradiating the deposited core material 110 with a laser beam or a high intensity UV light. Aggregation causes the core material particles to become more spherical in shape. Next, the aggregated core material particles 110 are coated with an insulating coating 116 via chemical vapor deposition (CVD) process. CVD is a chemical process used to produce high-purity solid materials. In a typical CVD reactor a substrate is exposed to volatile precursors of a certain material, which then react and/or decompose on the substrate surface to form a film of the material. CVD techniques that are applicable include low pressure CVD (LPCVD), Metalorganic CVD (MOCVD), Plasma enhanced CVD (PECVD), Rapid thermal CVD (RTCVD) and Vapor phase epitaxy (VPE), among others. Commercial CVD reactors are offered by Applied Materials (Santa Clara, Calif.), Novellus Systems (San Jose, Calif.) and Balzers (Liechtenstein). In one example, core material 110 is Fe particles, nucleating layer 112 is $SiO_2$, substrate 114 is fused silica and coating 116 is $SiO_2$. The thickness 90 of the as deposited core material is 10 nanometers, the thickness of the insulating layer 92 is 5 nanometers and the overall thickness 91 of the coated core material is 30 nanometers, shown in FIG. 1C. The average diameter 93 of the coated particle is 30 nanometers, shown in FIG. 1D. Referring to FIG. 2, the process repeats itself for four cycles and the resulting film 120 includes particles 1,2,3,4, from the corresponding four cycles. Particles 1,2,3,4 and surface 113 are coated with the insulator coating 116. In one example, the overall thickness 95 of the film 120 is 150 nanometers. In other examples, particles 1,2,3,4 are coated with the insulator coating 116 via a PVD process. The sizes, shapes, and densities of the core material islands 110 are suggestive of a variation that is tuned to achieve desired material properties, i.e. the process conditions are altered to provide variation in the size and density of the core material particles and the inter particle spacing and dielectric matrix thickness. These variations are known to affect the final magnetic, dielectric, and smoothness of the final film. If the smoothness or flatness of the final surface is inadequate, a chemical mechanical polishing (CMP) process can be interposed in the sequence or after the final deposition to provide the desired topology. In this case, it may be desirable to coat the surface with an insulating layer to isolate exposed nanoparticles the environment or subsequent conductive layers. The inter-core spacing distance 96 and the inter-core isolation distance 97, shown in FIG. 2, are important parameters in determining the degree of exchange coupling, low frequency and RF eddy current losses realized in the final film. In one example, the inter-core spacing distance 96 is between 25 and 150 nanometers and the inter-core isolation distance 97 is between 1 and 30 nanometers.

Figure 3:
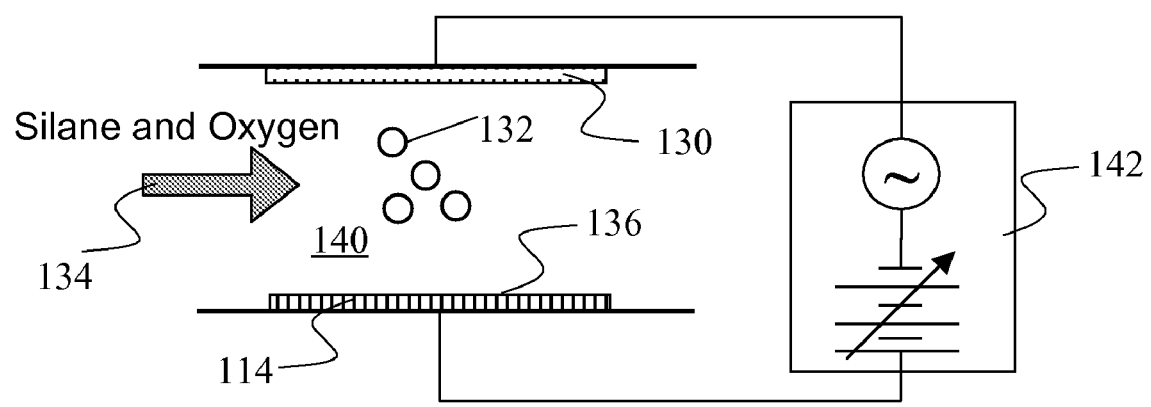
FIG. 3 is a schematic diagram of the apparatus for the combined PVD-CVD deposition of a magnetic nanocomposite material.

In another embodiment, a combined PVD and CVD process is applied to fabricate the magnetic nanocomposite films. Referring to FIG. 3, PVD deposition of the magnetic core material takes place in the presence or a reactive gas 134 to form the insulating coating on the magnetic nanoparticles 132. In one example, the reactive gas is reactive silane and oxygen or silane and ammonia in the presence of a background pressure of Argon to form an insulating coating of $SiO_2$ or $Si_3N_4$, or $Al_2O_3$. The Argon pressure is adjusted to effect changes in the size of the particles and the silane/oxygen ratio is adjusted to effect changes in the thickness of the coating insulator. As shown in FIG. 3, a target 130 of core material is sputtered in a back pressure of Argon that has been adjusted to achieve the desired particle size. These particles 132 are then coated with silica, as they are transported across the reactor 140 by the reaction of silane and oxygen 134 and continuously deposited on the substrate 114. The sputtering and CVD processes may proceed simultaneously or sequentially including in an overlapping manner so as to effect changes in the core particle size, coating thickness, and deposition rates. Particles 132 may also be biased with an electric field 142 or a magnetic field (not shown).

Figure 4:
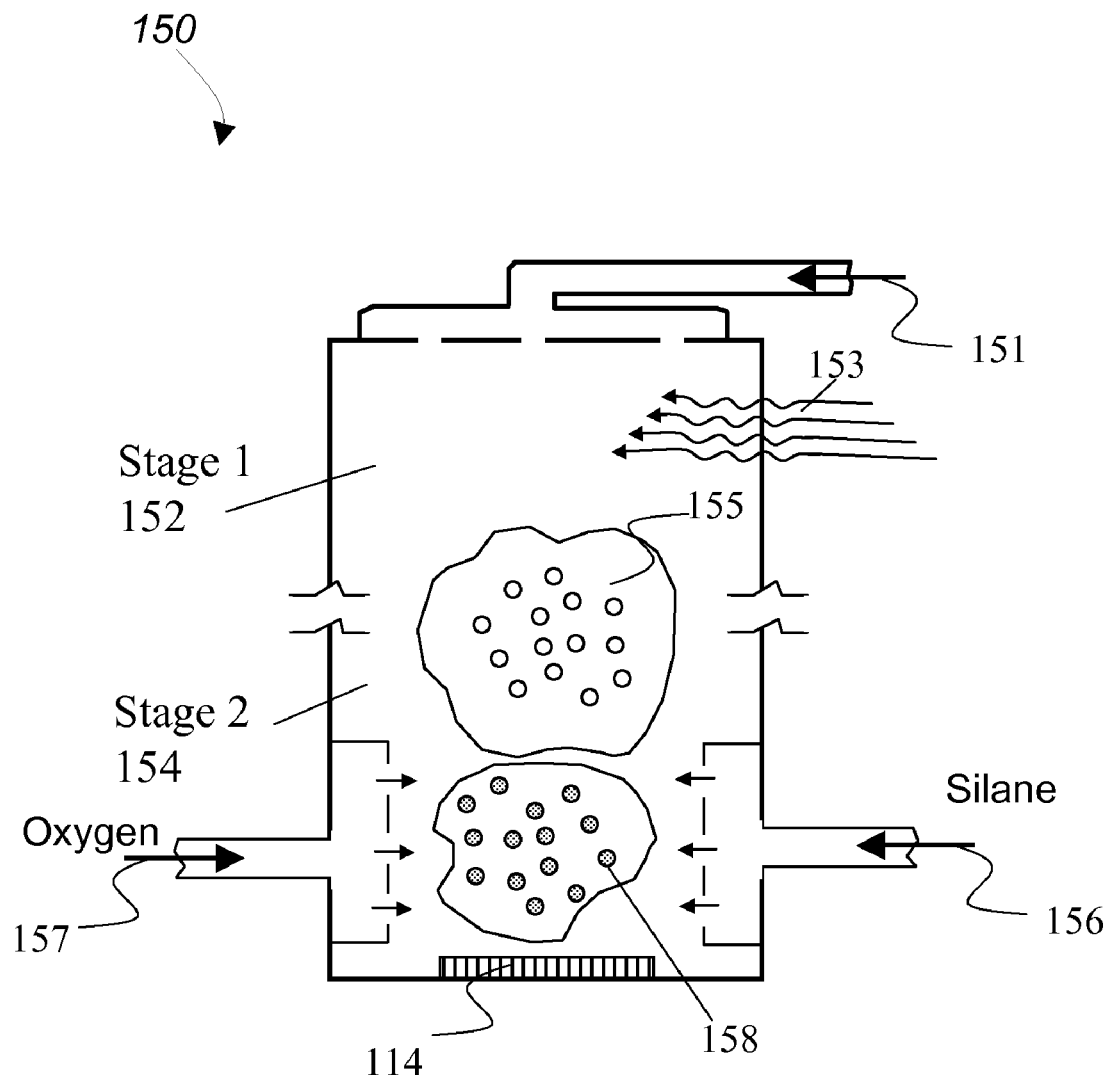
FIG. 4 is a schematic diagram of the apparatus for the deposition of a magnetic nanocomposite material from carbonyl precursors.

In another embodiment a multistage CVD process takes place in a cold wall flow reactor 150, shown in FIG. 4. In this method, aggregates of Ni, Co, NiCo, Fe, FeZn, Borides of these materials, alloys of these materials, or the like ferromagnetic materials are formed from their carbonyl precursors and then are coated with an $SiO_2$ overcoat in a subsequent downstream step in the same reactor. The $SiO_2$ overcoat is formed using a continuous or a pulsed formation process from a silane—oxygen reaction. Referring to FIG. 4, the cold wall flow reactor 150 includes two stages 152, 154 in which the core particles are first formed 152 and then coated with an insulator 154. Carbonyls 151 introduced in the upper part of the chamber 152 are decomposed with the assist of incident light 153 to form particles of the core material 155 that are subsequently coated with $SiO_2$ in the lower part of the chamber 154 where silane 156 and oxygen 157 are introduced. The coated particles 158 are subsequently deposited on substrate 114 suitable for electronic device fabrication at the bottom of the reactor 150. The carbonyl flow rate, light intensity, silane flow rate and oxygen flow rate are varied to effect changes in the characteristics of the film deposited on the product substrate.

Figure 5:
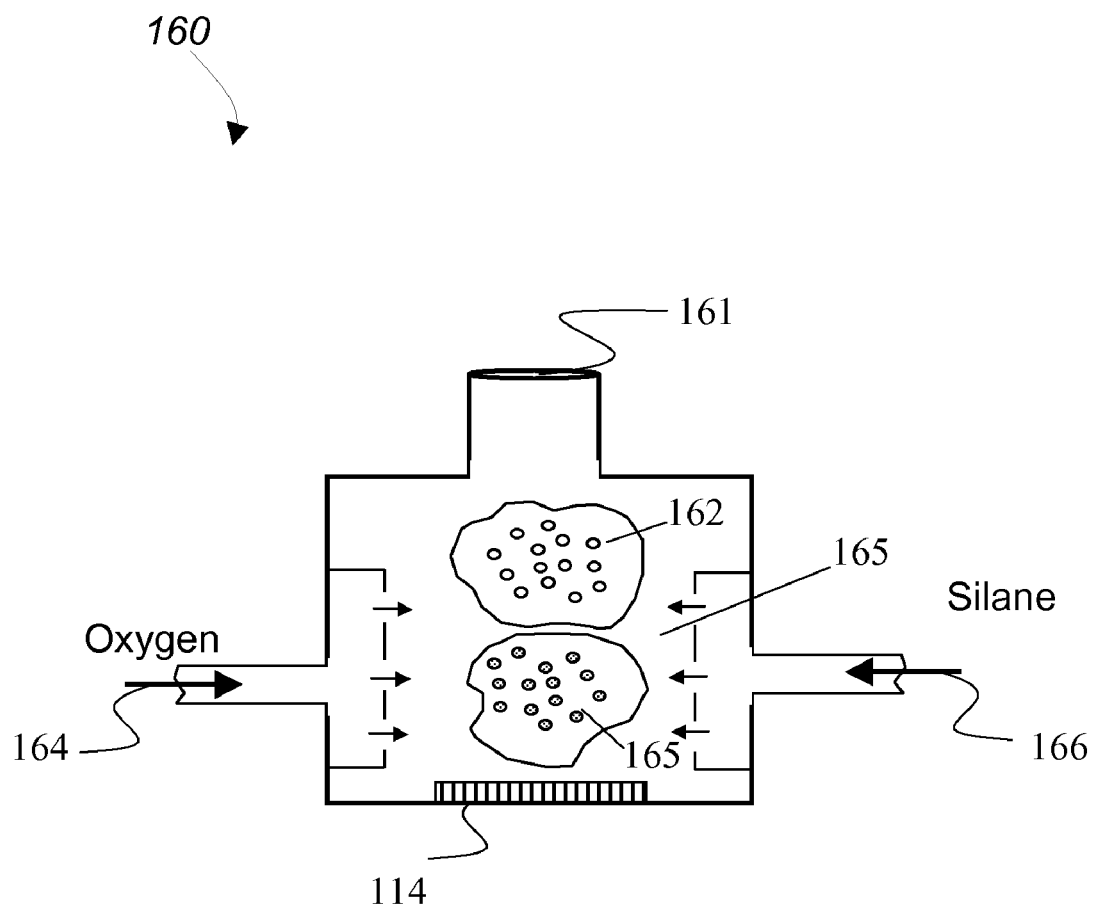
FIG. 5 is a schematic diagram of the apparatus for the deposition of a magnetic nanocomposite material from ion cluster beam.

Another method for forming the magnetic nanoparticles is by applying the Ion Cluster Beam (ICB) deposition process. Referring to FIG. 5, aggregates 162 of Ni, Co, NiCo, Fe, FeZn, Borides of these materials, alloys of these materials, or the like, ferromagnetic materials such as ferrites are formed in an Ion Cluster Beam (ICB) Deposition reactor 160 in the presence of silane 166 and oxygen 164, or in the downstream presence of silane or oxygen. The continuously formed aggregates 162 are then to coated with a film of $SiO_2$ 166 and then are deposited on a substrate 114, suitable for the formation of electronic devices. As shown in FIG. 5, the ion cluster beam source 161 introduces a cloud of particles of the core material 162. The clusters typically contain a few 10s of atoms of the core material. These clusters 162 then pass through the reactor zone 165 where silane 166 and oxygen 164 react to form $SiO_2$ which then coats the core material particles. The resulting coated particles 166 as well as $SiO_2$ itself are deposited on the substrate 114 and form a continuous film comprising of particles of core material dispersed in a silica matrix. The entry rate of core ion clusters and the silane-oxygen flows are controlled to vary the properties of the resulting nanocomposite film deposited on the product substrate.

Figure 6:
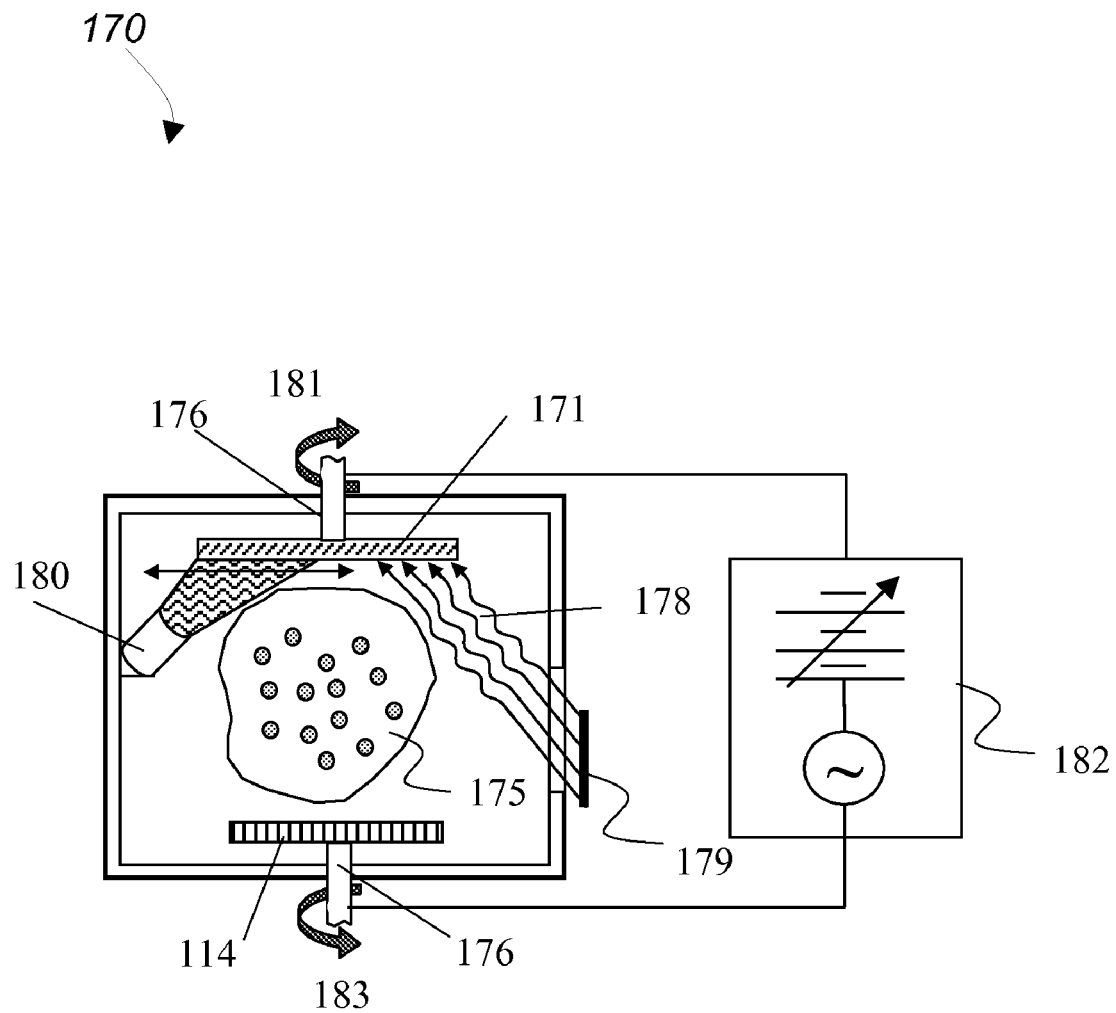
FIG. 6 is a schematic diagram of the apparatus for deposition of a magnetic nanocomposite material by ablation.

In another embodiment, the nanocomposite film is deposited by ablating a target of nanocomposite material. According to this method nanocomposite particles, such as silica coated aggregates Ni, Co, NiCo, Fe, FeZn, Borides of these materials, alloys of these materials, or ferromagnetic materials, are first formed into a target. In one example, the target is a disk having a thickness of 1-10 mm in thickness and 25-1000 mm in diameter and is formed by pressure sintering. This target 171 is then affixed to one plate 174 of a parallel plate vacuum chamber 170 with the other plate 176 holding the substrate 114 suitable for electronic device formation, shown in FIG. 6. Referring again to FIG. 6, the nanocomposite particles 175 are ablated from the target 171 by incident illumination 178 by one or several laser beams 179 that scan the surface of the target. Increasing the number of lasers used enhances the deposition rate and uniformity of the deposited film.

In one example, the lasers are arrayed around the periphery of the chamber 170 in one or more rows such that the beams 178 are aligned to impinge on the target 171 below the critical angle (to the normal) of reflection but so as to strike the target at several nominal radii from its central axis and each beam is mechanically or electro-optically scanned across a range of radii. The target 171 may be rotate about the central axis 181 so that the impinging laser beams 178 will uniformly ablate the target material. The substrate 114 may also be rotated 183 in like manner as the target 171, but asynchronously so as to improve the uniformity of the film deposition. Further, the target may also be optionally washed with one or more electron or ion beams 180 to assist in charging the ablated particles 175. The plates 174, 176 are biased by a variable AD/DC potential 182 in such a way as to induce the ablated particles to be preferentially transported to the substrate 114 where the nanocomposite particles are deposited as a film.

In yet another embodiment, the nanocomposite film is deposited by ablating a target of the magnetic material and a target of the insulating material. In this method magnetic nanoparticles, such as silica coated aggregates of Ni, Co, NiCo, Fe, FeZn, Borides of these materials, alloys of these materials, or ferromagnetic materials such as ferrites, are first formed into a target. In one example, the target is a disk having a thickness of 1-10 mm and a diameter of 25-1000 mm and is formed by pressure sintering. A second target is formed from the insulator ceramic or polymeric material. Both the magnetic particle target and the insulator target are positioned on plate 174 of reactor 170 and substrate 114 is placed on plate 176 so as to face both the magnetic particle target and the insulator target. The magnetic nanoparticles are ablated from the magnetic particle target by incident illumination by one or several laser beams that scan the surface of this target. The insulator target is also ablated simultaneously with the magnetic particle target. Co-evaporation of the two targets, followed by condensation onto the substrate 114 forms films comprising of insulator coated on the metal particles. Increasing the number of lasers used enhances the deposition rate and uniformity of the deposited film.

Other embodiments are within the scope of the following claims. For example, a magnetic or an electric field is employed in the deposition zones of FIG. 4-FIG. 6 between the target/inlet area and the deposition substrate area. These fields increase the deposition rates and control the size and location of the deposited particles. The magnetic or electric field may be constant or pulsed. Furthermore, microwaves of RF waves are used for the ablation process instead of or in addition to laser or other light source. In each of the cases above where an inorganic insulator is employed, an organic insulator may be substituted. In general, the use of an organic insulator changes the resulting dielectric properties, mechanical properties, water absorption capacity, and tolerance to temperature extremes in such a way as to make films produced in such a fashion substantially different from those employing inorganic insulators. The materials prepared with organic insulators have the advantage of not exposing the core materials to oxidation which has been noted to have deleterious effects on the magnetic properties of the films. In one example, the thickness of the deposited film is measured by Rutherford Back Scattering.

Several embodiments of the present invention have been described. Nevertheless, it will be understood that various modifications may be made without departing from the spirit and scope of the invention. Accordingly, other embodiments are within the scope of the following claims.

What is claimed is:

1. A method of fabricating a thin film of magnetic nanocomposite particles comprising:
    depositing isolated clusters of magnetic nanoparticles onto a substrate surface via a thin film deposition technique that is compatible with integrated circuit (IC) fabrication techniques; and subsequently
    aggregating said isolated clusters of magnetic nanoparticles; and subsequently
    coating said isolated clusters of magnetic nanoparticles with an insulator coating; and
    wherein said isolated clusters of magnetic nanoparticles have a dimension in the range between 1 and 300 nanometers and are separated from each other by a distance in the range between 1 and 50 nanometers; and
    wherein said substrate surface comprises a nucleating layer and wherein said deposition of isolated clusters of magnetic nanoparticles onto said nucleating layer is truncated at a point where clusters formed around nucleation sites are stopped before the clusters coalesce.

2. The method of claim 1 wherein said depositing, said aggregating and said coating are repeated until a desired film thickness is achieved.

3. The method of claim 2 further comprising measuring said film thickness.

4. The method of claim 2 wherein said film thickness is in the range between 10 and 1000 nanometers.

5. The method of claim 1 wherein said isolated clusters of magnetic nanoparticles are deposited via a physical vapor deposition (PVD) process.

6. The method of claim 1 wherein said isolated clusters of magnetic nanoparticles are coated with an insulator via chemical vapor deposition (CVD) process.

7. The method of claim 1 wherein said isolated clusters of magnetic nanoparticles are coated with an insulator via PVD process.

8. The method of claim 1 wherein said insulator coating comprises a thickness in the range between 1 and 30 nanometers.

9. The method of claim 1 wherein said nucleating layer comprises plasma activated silicon dioxide.

10. The method of claim 1 wherein said aggregating comprises thermally annealing said deposited isolated clusters of magnetic nanoparticles.

11. The method of claim 1 wherein said aggregating comprises irradiating said deposited isolated clusters of magnetic nanoparticles with a light source selected from a group consisting of lasers and UV light sources.

12. The method of claim 1 wherein said magnetic nanoparticles comprise materials selected from a group consisting of Fe, Ni, Co, NiCo, FeZn, borides of these materials, ferrites, rare-earth metals, and alloy combinations thereof.

13. The method of claim 1 wherein said substrate is selected from a group consisting of fused silica, oxidized silicon, quartz, silicon, GaAs, GaN, high temperature glass, alumina, silicon nitride, silicon carbide, semiconductor materials, refractive insulators, and organic printed circuit board materials.

14. The method of claim 1 wherein said insulator coating comprises material selected from a group consisting of $SiO_2$, $Si_3N_4$, $Al_2O_3$, oxides, ceramics, polymers, ferrites, and combinations thereof.

15. The method of claim 1 wherein said insulator coating comprises organic material selected from a group consisting of epoxies, Teflon®, and silicones.

16. The method of claim 1 wherein said depositing and said coating occur and in the same reactor.

17. The method of claim 1 wherein said isolated clusters of magnetic nanoparticles are deposited via sputtering a target comprising a magnetic material.

18. The method of claim 1 wherein said isolated clusters of magnetic nanoparticles are deposited via CVD.

19. The method of claim 18 wherein said magnetic nanoparticles are formed by decomposing carbonyl precursors of said magnetic material via electromagnetic radiation.

20. The method of claim 1 wherein said isolated clusters of magnetic nanoparticles are deposited via an ion cluster beam (ICB) deposition process.

21. The method of claim 1 wherein said depositing of isolated clusters of magnetic nanoparticles comprises ablating said magnetic nanoparticles from a target comprising a magnetic material and condensing said magnetic nanoparticles onto said substrate surface.

22. The method of claim 21 wherein said magnetic nanoparticles are ablated from said target by electromagnetic radiation selected from a group consisting of lasers, UV light, Radio Frequency (RF) waves and microwaves.

23. The method of claim 22 wherein said ablated magnetic nanoparticles are ionized by a particle beam selected from a group consisting of electron beam, ion beam, and molecular beam.

24. The method of claim 21 wherein said target is rotated during said ablation.

25. The method of claim 21 wherein said substrate is rotated during said deposition.

26. The method of claim 21 wherein said coating of said isolated clusters of magnetic nanoparticles with said insulator coating comprises ablating particles of said insulator from a target comprising said insulator and condensing said insulator particles onto said magnetic nanoparticles and said substrate surface.

27. The method of claim 26 wherein said ablating of said magnetic nanoparticles and said ablating of said insulator particles occur in the same reactor.

28. The method of claim 1 wherein said depositing is enhanced by a magnetic field or electric field.

29. The method of claim 1 wherein said coating is enhanced by an electric field or magnetic field.

* * * * *